US007110839B2

(12) United States Patent
Wood

(10) Patent No.: US 7,110,839 B2
(45) Date of Patent: Sep. 19, 2006

(54) AUDIO SYSTEM FOR MINIMIZING THE CHANCE THAT HIGH POWER AUDIO SIGNALS MAY BE DIRECTED TO A HEADPHONE JACK

(75) Inventor: Bradley C. Wood, Canoga Park, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 941 days.

(21) Appl. No.: 09/969,452

(22) Filed: Oct. 1, 2001

(65) Prior Publication Data

US 2002/0059008 A1 May 16, 2002

Related U.S. Application Data

(60) Provisional application No. 60/237,549, filed on Oct. 2, 2000.

(51) Int. Cl.
*G06F 17/00* (2006.01)
*H03G 11/00* (2006.01)
*H04R 1/10* (2006.01)
*H02B 1/00* (2006.01)

(52) U.S. Cl. ............................ 700/94; 381/55; 381/74; 381/123

(58) Field of Classification Search .................... 381/7, 381/11, 55, 74, 81, 85, 123; 700/94
See application file for complete search history.

(56) References Cited

U.S. PATENT DOCUMENTS 5,161,198 A * 11/1992 Noble ......................... 381/81
5,255,324 A * 10/1993 Brewer et al. .............. 381/107
6,069,960 A * 5/2000 Mizukami et al. ............ 381/74
6,268,845 B1 * 7/2001 Pariza et al. ................ 345/581
2001/0042146 A1 * 11/2001 Bolleman et al. ............. 710/62

* cited by examiner

*Primary Examiner*—Sinh Tran
*Assistant Examiner*—Daniel R. Sellers

(57) ABSTRACT

This invention provides a speaker system that minimizes the number of wires used to provide power and audio signal to all of the speakers. This is accomplished by without generating interference noises from shared signal wire implementations. The invention also provides a methodology for reducing power signals from being transmitted to headphones inserted into a headphone jack. The invention may use four wires to operate the speaker system. A first wire may be used to provide the control data signal common and control power common, and, if a headphone is used, the first wire may also serve as a common ground connection for the earpieces in the headphone. The second wire may provide a substantially constant current, so that constant current may be carried in the first wire regardless of the voltage on the second power/data wire. This way, the first wire may serve as a common control circuitry and the headphone as well. There may be no interference associated with sharing the first wire because constant current may be provided as a source of power that is independent of the voltage that appears on the second wire in the system. If a headphone is used, the current may be substantially constant in the second wire so that the voltage change in the second wire may not change the voltage in the first wire. Without the voltage change in the first wire, the signals to the headphone is not disturbed.

11 Claims, 4 Drawing Sheets

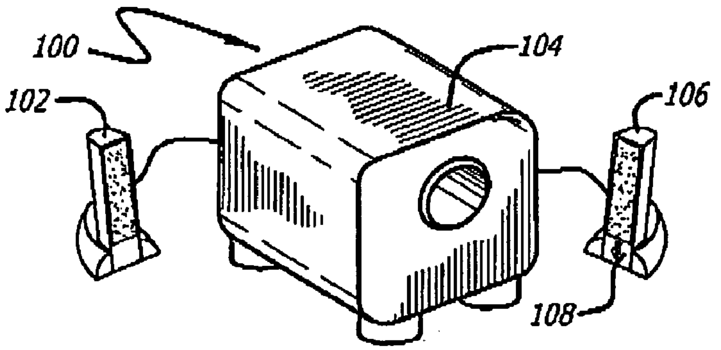
FIG. 1
FIG. 2
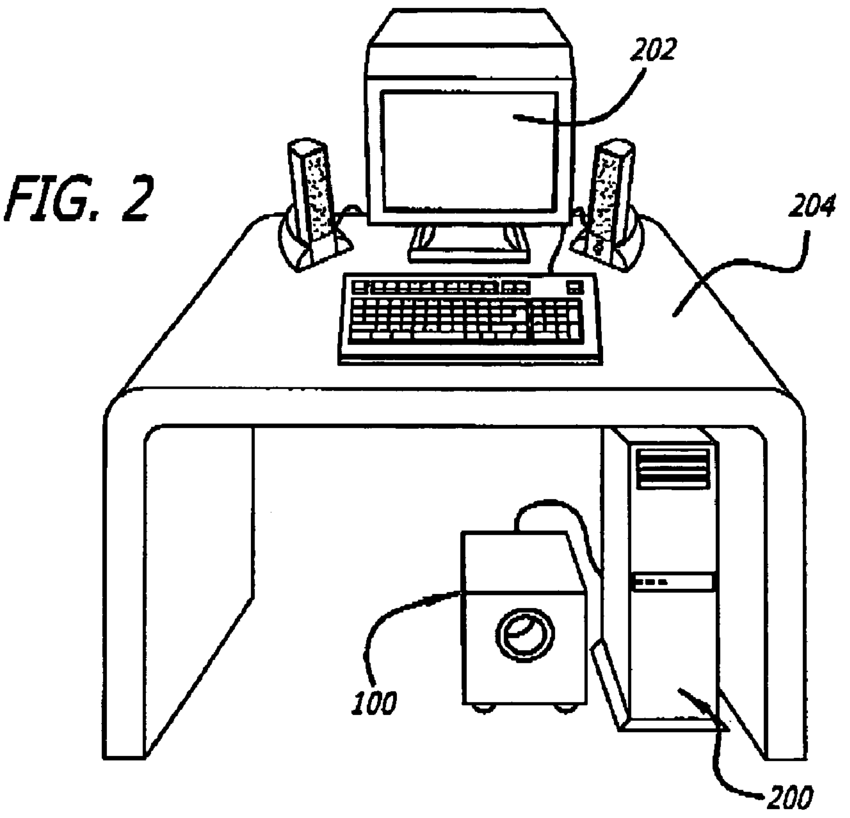
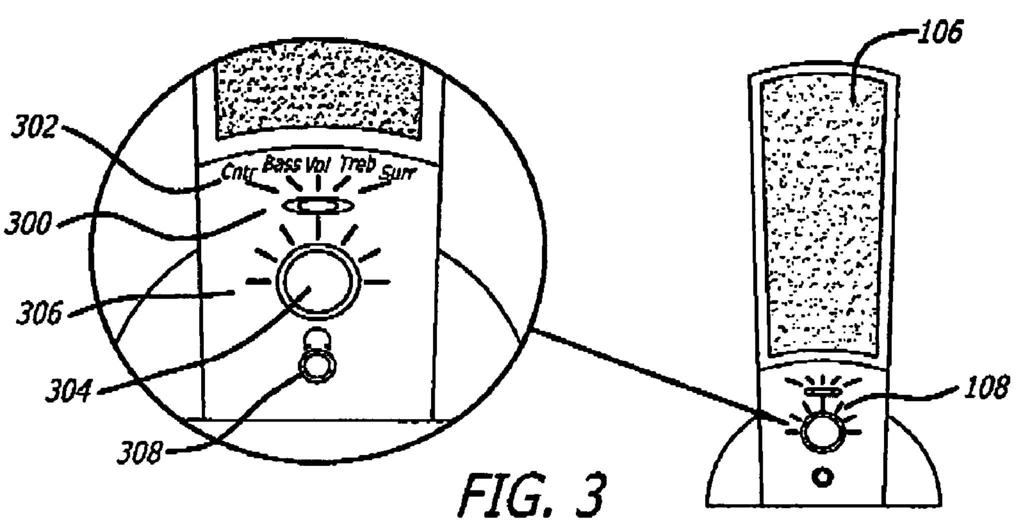
FIG. 3

AUDIO SYSTEM FOR MINIMIZING THE CHANCE THAT HIGH POWER AUDIO SIGNALS MAY BE DIRECTED TO A HEADPHONE JACK

CROSS-REFERENCE TO RELATED APPLICATIONS

This application claims priority of U.S. Provisional Patent Application No. 60/237,549 filed Oct. 2, 2000.

BACKGROUND OF THE INVENTION

1. Field of the Invention

This invention relates to an audio system that minimizes the wires that are used to electrically couple the speakers thus minimizing the chances that high power audio signals may be directed to a headphone jack.

2. Related Art

A speaker system is commonly hooked up to an audio system such as those typically found in desktop and laptop computers to enhance the listening experience. A typical computer based speaker system generally may include left and right satellite speakers typically placed on either side of the computer, and possibly a subwoofer is usually located nearby. The subwoofer may be larger than the two satellite speakers because of its larger diaphragm typically required for production of bass sounds. The subwoofer may house a power amplifier and controls for the speaker system. By placing the controls on the subwoofer, audio system control management is often inconveniently located. For convenience, a speaker system may provide controls on one of the satellite speakers so the controls are within the reach of the listener to adjust the volume, treble, and bass. Besides these controls, a headphone output for private listening may be provided with the speaker system or computer system.

Cables may be used to provide power and audio signals to all of the speakers. Each cable may have more than ten wires to provide all of the control functionality to the satellite speakers and the headphone connection. Using ten or more wires, however, can make the cable bulky, stiff, and expensive to manufacture. Asthetically, with all of the wires feed into the rear panel on of the computer presents a cluttered and unappealing appearance. In addition, the additional wires increases the number of connectors. However, besides increasing manufacturing costs, connectors are an unreliable component creating opportunities for system failure, malfunction or noise.

Others have tried to minimize the number of wires in a speaker system by transmitting power, control, and audio signals through shared wires. Using one wire for multiple purposes, however, can cause signal interference. As the control signals are transmitted via the same wire carrying power for the speaker, signal interference may create audible artifacts in the audio signal. Thus, using one wire for multiple purposes can degrade the quality of the sound that is produced by the speaker system, as well as create other malfunctions.

In addition to the controls, the satellite speakers may have headphone jack hookups. When the headphone plug is inserted into the jack, a switching mechanism is usually provided to provide audio signals to the headphone rather than to the loudspeakers, i.e., the satellite speakers and the subwoofer. The switching mechanism generally reacts to contacts or the mechanical motion of the plug being inserted into the jack. This scheme creates a potential risk to a user when the headphone plug is initially inserted into the headphone jack. One alternative is to make electrical contact before the mechanical switch is actuated, thereby redirecting the high power signal for the loudspeaker to the headphone. However, this could either damage the earpieces in the headphones or injure the listener's ear.

Therefore, a need exists for (1) preventing high power audio signals from being directed to the headphone jack and (2) a speaker system that minimizes the number of wires that are used without implementing shared signal wires.

SUMMARY

This invention relates to a speaker system that minimizes the number of wires that are used to provide power and audio signal to all of the speakers without generating interference noises. A speaker system may include a left satellite speaker, a right satellite speaker, and a subwoofer. Other speakers may be included in the speaker system, such as two rear satellite speakers. The subwoofer may also incorporate the amplifier module to power the speaker system. The right satellite speaker, for example, may be equipped with control knobs to adjust the operation of the speaker system, and a series of indicating lights. The indicating lights may be a series of Light Emitting Diodes (LEDs). The right satellite speaker may have a headphone jack adapted to receive a headphone plug for private listening. The right satellite speaker may be a self-contained amplified sound system that is coupled to an audio signal source from a computer sound card, CD player, or other source of audio signals.

In one embodiment of the invention, four wires may be used to provide audio signals to the right satellite speaker, the power for the control electronics inside the right satellite speaker, and the power for the LEDs that display the state of the speaker system at a particular time, including for example, the setting for the volume, the treble, the bass, the surround level and the center channel level. When the headphone is used, the output from the right satellite speaker provides both left channel and right channel signals to the left and right earpieces of the headphone, respectively.

The four wires may be used as the following: A first wire may be used to provide the control data signal common and control power common; and if the headphone is used, the first wire may also serve as a common ground connection for the earpieces in the headphone. The second wire may provide a substantially constant current as further described in detail below, so that constant current may be carried in the first wire regardless of the voltage on the second power/data wire. This way, the first wire can serve as a common to the control circuitry and the headphone as well. In particular, even though the first wire may be used for the control data signal ground and the control power ground, there may be no interference associated with sharing the first wire because constant current may be provided as a source of power that is independent of the voltage that appears on the second wire in the system.

If a headphone is used, because the current is substantially constant in the second wire, voltage change in the second wire may not change the voltage in the first wire. Without the voltage change in the first wire, the signals to the headphone may be undisturbed. And, the low power supplied to the headphone means that the changes in the headphone current are relatively small, so that the voltage drop induced in the first wire may be low as well, and may be readily tolerated by the data receiver circuitry in the subwoofer module. In case of large voltage drops that are enough to generate data errors, such errors may be removed by local measurements of headphone current, along with the prior knowledge of the first wire's resistance to modify the data signal to remove the data errors.

A second wire may be used to provide both the power for the control and display circuitry in the form of a constant current, and data. The data, for example, may be an output voltage signal made to appear on the second wire, which may be the control information going back to the subwoofer/amplifier. When the right satellite speaker is used, a third wire may provide a positive polarity signal to the right speaker driver(s) and a fourth wire may provide a negative polarity signal to the right speaker driver(s).

If the headphone is used, the third wire may become one channel for the headphones, such as the left channel; and the fourth wire may become the right channel signal for the headphones for example. One of the advantages with this invention is that a small number of wires are used. Moreover, with the above speaker system, the data transmission does not create an audible signal to interfere with either the speaker signal or the headphone signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

FIG. 1 is a speaker system having two satellite speakers and a subwoofer.

FIG. 2 is the speaker system illustrated in FIG. 1 connected to a computer system.

FIG. 3 is a closeup view of the controls and displays in one of the satellite speakers in FIG. 1.

DETAILED DESCRIPTION OF THE PREFERRED EMBODIMENTS

Figure 4:
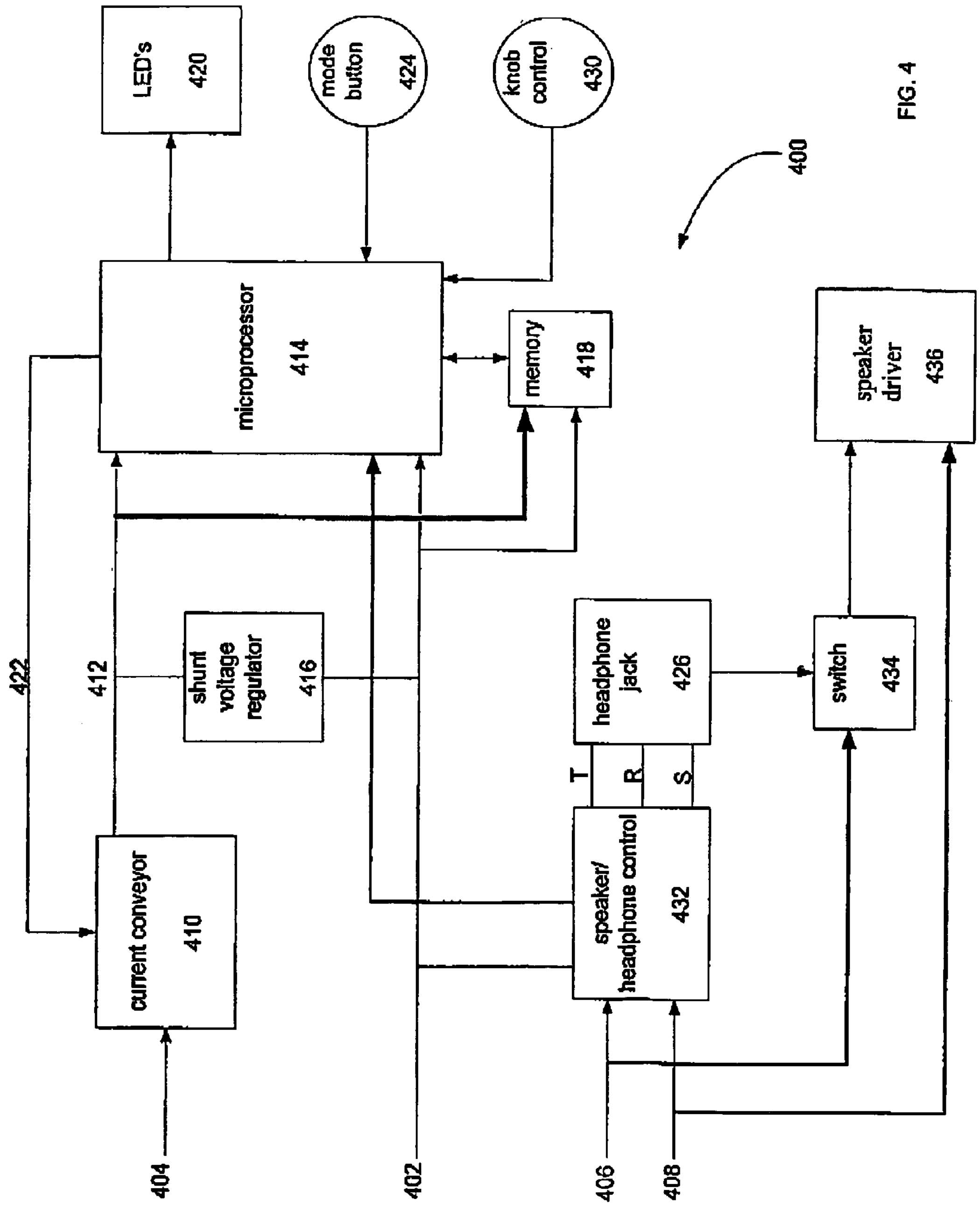
FIG. 4 is a block diagram illustrating a control system for operating a speaker system using four wires.

FIG. 1 is a front view illustrating a speaker system 100 including a left satellite speaker 102, a subwoofer 104, and a right satellite speaker 106. The speaker system 100 may also include rear speakers (not shown) for surround sound. In this embodiment, a control system 108 for the speaker system 100 may be conveniently located in the right satellite speaker 106. Of course, the control system 108 may be located in the left satellite speaker 102 as well, or remotely, nearby the speaker system 100. FIG. 2 is a front view illustrating the speaker system 100 hooked up a computer system 200 where the computer monitor 202 may be between the two satellite speakers 102 and 106, and the subwoofer 104 may be underneath a desk 204.

FIG. 3 is an exploded view illustrating the control system 108 incorporated into the right satellite speaker 106. The control system 108 may include a mode button 300 that allows selection of a variety of settings for a listener to adjust. For instance, the mode button 300 may operate to select five different settings to permit independent adjustments of five parameters such as: center level, bass, volume, treble, and surround level or any other audio signal parameters. Five light emitting diodes (LEDs) 302 may be used to indicate which one of the five parameters has been selected by the mode button 300. For example, if the mode button 300 is selected to adjust the volume then the LED for the volume may light up. To select from one of the five modes, the mode button 300 may be pressed until the LED for the desired parameter lights up. For example, if the system is in the volume adjustment mode initially, then the successive pressings of mode button 300 may move from treble, surround, center, bass, and back to volume.

The control system 108 may also include a control knob 304 with a number of LEDs 306 around the control knob 304. Once the mode button 300 is used to select a desired parameter, the control knob 304 may be used to adjust that particular parameter. For example, if the mode button 300 is pressed to select the volume parameter, then the control knob 304 may be rotated to increase or decrease the volume. The same procedure may be followed to adjust the treble, bass, surround sound, and the center level. Alternatively, the control system 108 may have a default mode so that a user does not have to sequence through the other modes to select the default mode to make adjustment to that mode. For example, after a few seconds, the active mode may default back to the volume mode so that a user may adjust the volume without having to sequence through the other parameters.

The control system 108 may also include a headphone jack 308 for private listening. Once a plug for the headphone is inserted into the headphone jack 308, the audio signal may be transmitted to the earphone speakers in the headphone. At the same time, the control system 108 may mute the audio signals to the speakers and the surround adjustment mode may be disallowed.

FIG. 4 illustrates a block diagram 400 according to one embodiment of the invention for performing the features and functions described above for the speaker system 100 using minimal wires. The block diagram 400 may use four wires to operate the speaker system 100. A first wire 402 may be described as the signal and control common connector, or ground connector, including the headphone ground. A second wire 404 may be described as the power/data wire. A third wire 406 may be described as the "right satellite+/HD", where "HD" stands for headphone. And a fourth wire 408 may be described as the "right satellite−/HD."

A current conveyor 410 may have a plurality of inputs and an output. The first input may be both power and data through the second wire 404. The second input may be a voltage control through a wire 422, which may be driven by the data output from a microprocessor 414. The power through the second wire 404 may be generated from a generator that outputs a substantially constant current. This way, current may be substantially independent from the voltage that appears on the second wire 404 so that modulation of the voltage does not affect the current. Generators that provide constant current are well known in the art, and may be done using a variety of methods such as transistors and op-amps, or simply by using a high voltage applied to a very large resistance. The generator that provides the constant current may be in the subwoofer module.

The data from the microprocessor 414 connected to the second input of current conveyor 410 via wire 422 may cause the voltage on the second wire 404 to vary in a predetermined way. For example, the voltage may be a replica of the voltage on wire 422, or may be scaled up or down and have a positive or negative offset applied, or have a polarity inversion as well. This way, the voltage on the second wire 404 may be transmitted to subwoofer module 104, which varies in a predetermined way in accordance with data from microprocessor 414 to permit control of the circuitry in subwoofer module 104.

The output from the current conveyor 410 may be substantially the same current as the input current into the current conveyor 410, and may be coupled to a shunt voltage regulator 416. The shunt regulator 416 may regulate the voltage relative to first wire 402 to be a constant voltage suitable for powering circuitry such as microprocessor 414 and memory 418. In addition, the shunt voltage regulator 416 may be coupled to the first wire 402 so that any excess current not used by the speaker system 100 may be shunted to a common through the first wire 402. This way, the voltage modulation and the current flowing into the current conveyor 410 and into the entire speaker system 100 may be no more or less than the substantially constant current generated by the current source in the subwoofer module.

As known to those skilled in the art, the current source may be specified first by the amount and the polarity of the current expressed in units of amperes, and may also have an additional parameter of output impedance of some high finite value, since no current source is perfect. Associated with the current source may be the voltage range over which it can deliver the constant current, and any physically real current source may generally behave as a current source only over a limited amount of voltage range. Such limitation is sometimes called a compliance voltage.

The microprocessor 414 thereafter supplies the signals to a set of LEDs 420 to indicate which of the tone or control features has been selected. The memory 418 may be used to retain data when the power is switched off or shortly after a control change has been made. An example memory 418 may be electrically erasable programmable read-only memory (EEPROM). The microprocessor 414 may also accept inputs from the mode button 424 and the control knob 430 to monitor the desired parameters to be adjusted by the listener. In addition, the microprocessor accepts an input from the circuitry associated with a speaker/headphone control 432, which associates with the headphone jack 426, switch 434, and speaker driver 436, as described in detail below.

In the block diagram 400, the data may flow from the control module to the subwoofer module, but not in the reverse direction. However, it is within the scope of the invention to have a bi-directional data transmission capability by varying the constant current at any given time. This may be accomplished by suppressing the variable voltage drop on the return wire, the first wire 402, which may be done in conjunction to provide a constant current because it is the constancy of that current source that allows the invention to use the first wire 402, in the headphone mode, as the common wire.

If the current is modulated in a smooth and continuous fashion at a sufficiently high frequency to be out of the range of audibility, then the data may be transmitted in the reverse direction and decoded by additional circuitry to sense the actual current level. At that same time, as long as there is a sufficient current to power up the shunt regulator 416 and the microprocessor 414, there may be no ambiguity as to measuring that current. In other words, it could be used as a duplex connection. Alternatively, there may be other devices that could be employed, for example, operational amplifiers could be used in place of the discrete transistors. Still further, commercially available current conveyor devices may be used in lieu of the transistors and/or op-amps.

Accordingly, the block diagram 400 provides an audio systemfor modulating the voltage on the same line supplying the constant current, and the current may be used for power. The microprocessor, under a programmed control and in response to various inputs from the control knob 430 and the mode button 424, provides the command signals to the main subwoofer module 104 and then also the display, multiplexing the voltages among the array of LEDs 302, at a fast enough rate so that the user does not notice flickering. As such, the invention provides a speaker system that minimizes the number of wires that are used by sharing a predetermined number of wires without generating interference noise due to different signals that are present in the wire.

Figure 5:
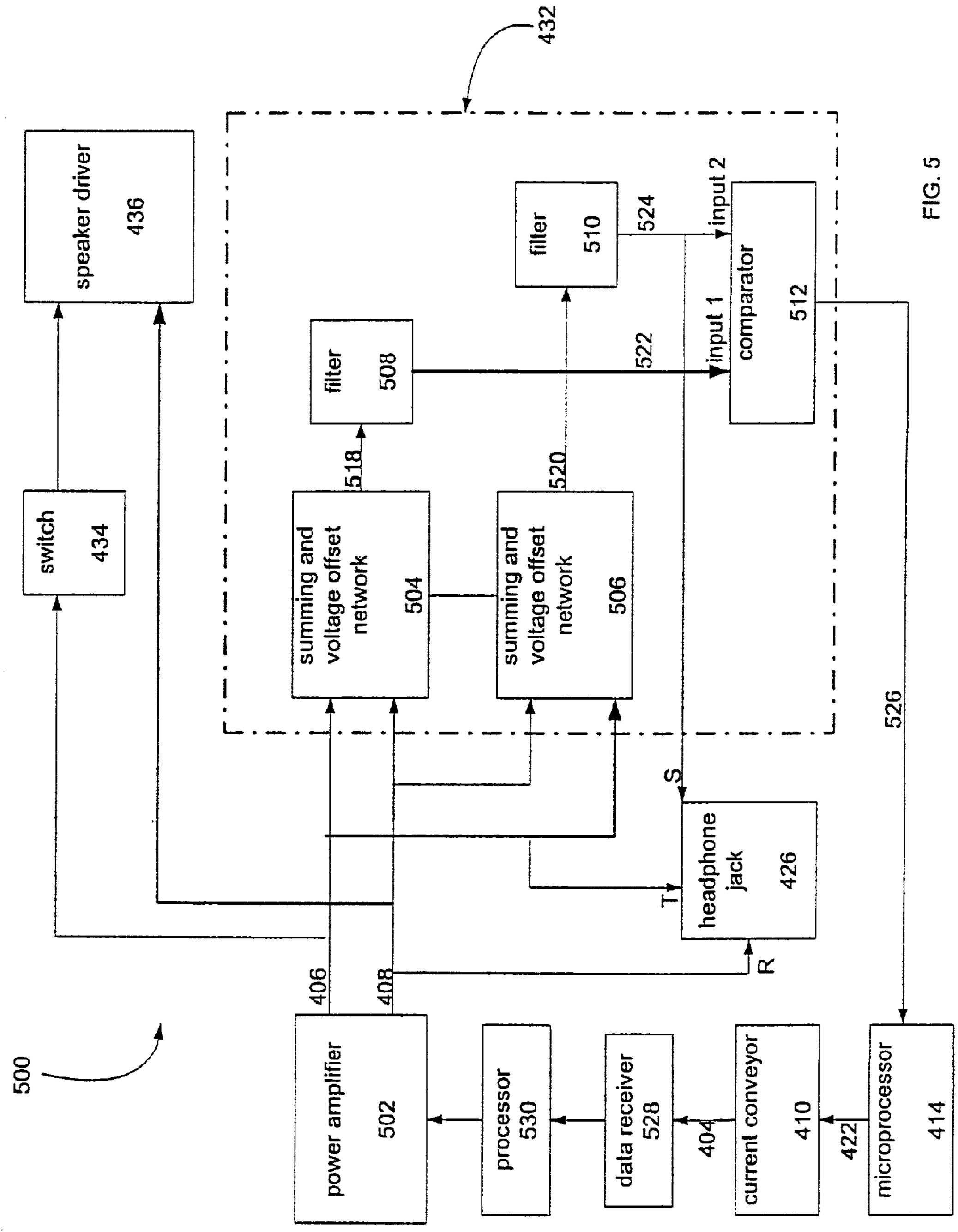
FIG. 5 is a block diagram illustrating a method and system for safely inserting a headphone plug into a headphone jack.

FIG. 5 illustrates a block diagram 500 directed to safely inserting the headphone plug into the headphone jack. The block diagram 500 may include a power amplifier 502 in a subwoofer module 104 with two outputs, the third wire 406 and the fourth wire 408. In particular, FIG. 5 describes in more detail the speaker/headphone control 432 where, in the right satellite speaker, there may be additional circuitry including a first summing and voltage offset network 504, a second summing and voltage offset network 506, a first low-pass filter 508, a second low-pass filter 510, and a voltage comparator 512. In addition, the switch 434 may be ahead of the speaker drivers 436 to open the circuit when the switch 434 is actuated. The switch 434 may be mechanically actuated by the insertion of the headphone plug into the headphone jack 426.

When the speaker system 100 is on and the headphone is not used, the power amplifier 502 produces audio signals on the third and fourth wires 406 and 408, respectively. The voltage in the two wires 406 and 408 may be in an opposing polarity with no audio signal present so that a DC voltage of approximately the average of the maximum and minimum instantaneous audio signal voltages may be present. The voltages on the two wires 406 and 408 serve as inputs to first summing and voltage offset network 504 and second summing and voltage offset network 506. The third wire 406 may also be electrically coupled to one side of switch 434 and the tip (T) contact of headphone jack 426. The fourth wire 408 may be electrically coupled to a terminal of the speaker driver 436 and the ring (R) contact of headphone jack 426.

The output wire 518 of the summing and offset network 504 may have a voltage with a series resistance that may be of order 1.0 kΩ and that may be equal to the average of the voltages on the wires 406 and 408, with a small DC offset added or subtracted. Since the audio signals, if present, on the wires 406 and 408 may be in opposing polarity but equal in magnitude, they may cancel and do not appear on the wire 518. Similarly, the output wire 520 of network 506 may also have a voltage that may be an average of voltages on the wires 406 and 408, with a DC offset, and with a series resistance. Like the wire 518, no audio signal may appear on the wire 520 due to the similar cancellation effect.

The wires 518 and 520 may serve as inputs to low-pass filters 508 and 510. The low-pass filters may be as simple as capacitors shunting energy at high frequencies to system ground, corresponding to the first wire 402. The outputs of the low-pass filters 508 and 510 on wires 522 and 524, respectively, may be connected to inputs of the comparator 512. The wire 524 may couple to the sleeve (S) connection of headphone jack 426. The comparator 512 may have an output voltage that appears on a wire 526, which may be electrically coupled to an input of the microprocessor 414. Depending on the DC voltage difference between the two wires 522 and 524, the microprocessor may be either at a high logic level or a low logic level. For example, when the voltage on wire 522 exceeds the voltage on the wire 524, the comparator's output voltage and the microprocessor's coupled input voltage may be at a high logic level. Conversely, when the voltage on wire 524 exceeds the voltage on the wire 522, for this example the comparator's output and the microprocessor's coupled input may be at a low logic level.

When the headphone plug is inserted in headphone jack 426, the first electrical connection may be made between the sleeve (S) contact in the headphone jack 426 and the ring (R) contact on the headphone plug, due to the mechanical arrangement of the sleeve and ring contacts in the headphone jack. This may occur in many types of headphone jacks before any actuation of the switch 524. As the headphone plug is initially inserted into the headphone jack, the initial impedance between the sleeve and ring contacts of the jack may be low because the plug tip contact touches both jack sleeve and ring contacts before the plug is fully inserted. As such, the voltage at wire 524 at the input of the comparator 512 may be changed to be substantially similar to the DC voltage at the fourth wire 408. As such, the offset voltages in the first and second networks 504 and 506 may be adjusted to a predetermined level so that the polarity of the voltage difference at the inputs of comparator 512 are immediately reversed from the polarity before the headphone plug is inserted into the headphone jack 426. In response, the logic level at the output of comparator 512 on wire 526 may also reverse from its state prior to the headphone plug being inserted into the headphone jack.

The microprocessor 414 responds to the reverse in the logic level and outputs control voltage data through the wire 422 to the current conveyor 410 to vary the voltage on the second wire 404. The voltage on the second wire 404 appears on the input side of a data receiver 528, which may be within the power amplifier 502. The output of the data receiver 528 may be transmitted to an additional circuitry 530 such as a processor to decode the control voltage data and cause the power amplifier 502 to switch its output signals on the third and fourth wires 406 and 408 to lower power levels. This way, the headphone is not damaged due to excess power delivered to the headphone and the listener's ears are not harmed. The power amplifier may also make the signal on the fourth wire 408 to become a positive-polarity left channel audio signal for a proper stereo headphone operation.

Figure 6:
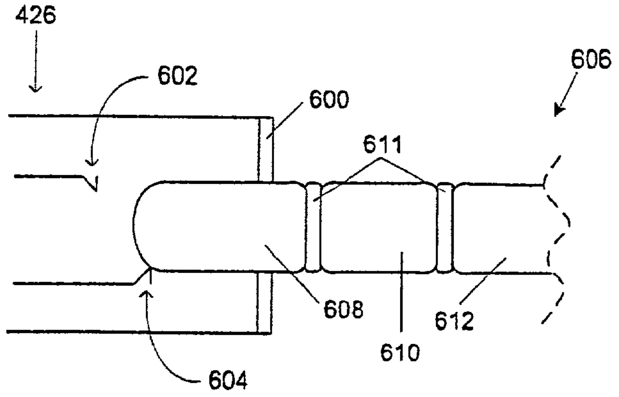
FIG. 6 a cross sectional view of a headphone plug illustrating an initial stage of the headphone plug being inserted into a headphone jack.

FIGS. 6 through 9 illustrate one exemplary operation of the block diagram 500 as a plug for the headphone is inserted into the headphone jack 426. FIG. 6 is a cross sectional view illustrating the headphone jack (HJ) 426 having a sleeve 600 enclosing a tip 602 and a ring 604. The plug 606 for the headphone (HP) may be divided into three portions, a tip 608, a ring 610, and a sleeve 612, separated by insulators 611. As the plug 606 is initially inserted into the HJ, the tip 608 of the HP makes contact with the ring 604 and sleeve 600 of the HJ. This may cause an electrical short between the sleeve 600 and ring 604 of the HJ. In turn, the voltage on the wire 524 may become same as the voltage on the wire 408, to which the ring is connected, which means that the comparator 512 may have higher voltage on input 2 (associated with the wire 524) than on the input 1 (associated with the wire 522). This causes the comparator 512 to output a logic level change on the wire 526, which causes the microprocessor 414 to generate a control voltage data to the current conveyor 410 via wire 422 thus varying the voltage on the wire 404 as described above. Then the power amplifier 502 lowers the power level delivered to the headphone.

Figure 7:
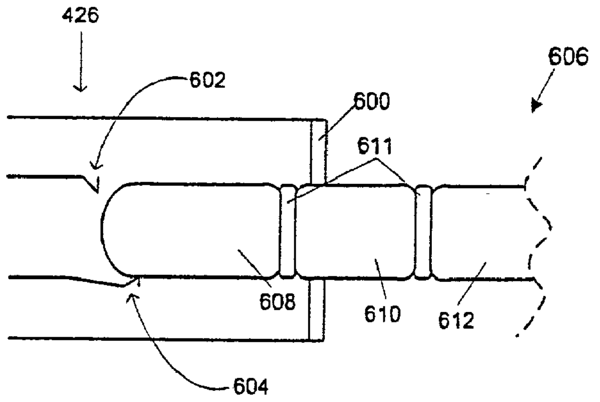
FIG. 7 a cross sectional view of a headphone plug illustrating the headphone plug of FIG. 6 being further inserted into the headphone jack.

FIG. 7 is a cross sectional view illustrating the tip 608 of the HP contacting with the ring 604 of the HJ, and ring 610 of the HP contacting with the sleeve 600 of the HJ. Such contacts electrically put each of the HP earpiece coil's d.c. resistance in series with sleeve 600 and ring 602 of the HJ. The effect on the wire 524 may be substantially the same as in FIG. 6, i.e., providing a lower power level to the headphone.

Figure 8:
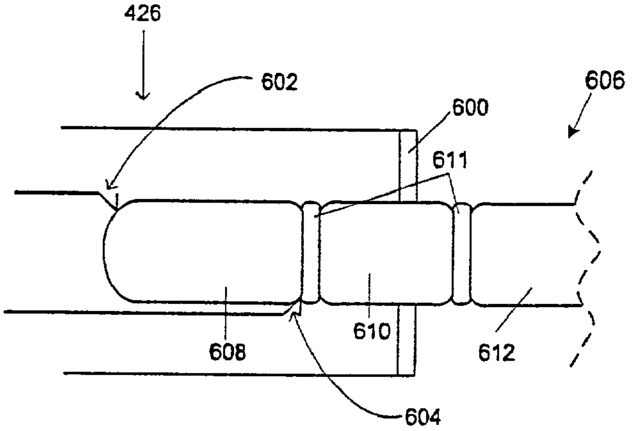
FIG. 8 a cross sectional view of a headphone plug illustrating the headphone plug of FIG. 7 being further inserted into the headphone jack.

FIG. 8 is a cross sectional view illustrating the tip 608 of the HP contacting the tip 602 and ring 604 of the HJ, and the ring 610 of the HP contacting with the sleeve 600 of the HJ. This may cause an electrical short between the tip 602 and ring 604 of the HJ. This results in having the headphone earpiece impedance in series with tip 602, ring 604, and sleeve 600 of the HJ. In turn, the effect on wire 524 may be substantially similar as in FIG. 7 so that a lower power level may be delivered to the headphone.

Figure 9:
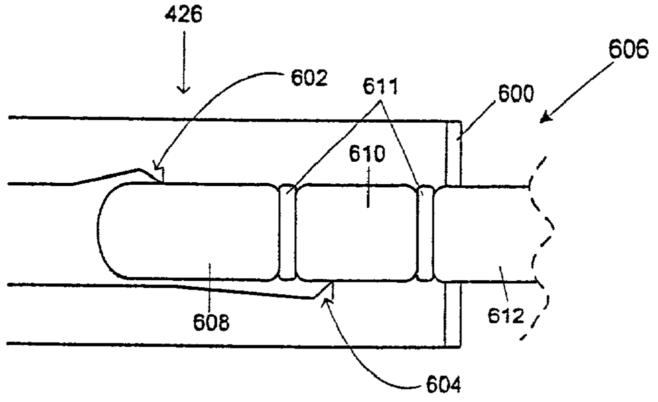
FIG. 9 a cross sectional view of a headphone plug illustrating the headphone plug of FIG. 8 fully inserted into the headphone jack.

FIG. 9 is a cross sectional view illustrating a tip 602 to tip 608, a ring 604 to ring 610, and a sleeve 600 to sleeve 612 contacts of HJ to HP, respectively. This may actuate the switch 434 and may cause DC voltage on the third and fourth wires 406 and 408 to appear on the wire 524, to preserve the state the comparator 512 may be in as in FIGS. 7 and 9. Accordingly, as the headphone plug is inserted into the headphone jack, the method and system described above prevents redirecting power to the headphone that is intended for the loudspeakers.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. A speaker system, comprising:

a first wire;

a second wire coupled to a current conveyor providing power and data, where the power is generated from a generator that provides a substantially constant current;

a microprocessor coupled to the current conveyor, where the microprocessor sends control voltage data to the current conveyor to vary the voltage on the second wire, where the current conveyor outputs a current that is substantially similar to current through the second wire that is substantially independent of the voltage in the second wire;

a shunt voltage regulator coupled to the output of the current conveyor and the first wire to shunt excess current through the first wire, and provide a substantially constant voltage to power the microprocessor, where the microprocessor is coupled to a control to detect an adjustment made by a user and based on the adjustment adjusting the control voltage data to the current conveyor to transmit the control voltage data to a data receiver so that the output of the data receiver corresponds in a predetermined way to the control voltage data;

third and fourth wires coupled to the generator, where the generator provides opposing polarity audio signal voltages to the third and fourth wires;

the third and fourth wires coupled to a speaker-headphone control (SHC), where the SHC produces a d.c. bias voltage in series with a predetermined resistance and applies the voltage to a sleeve conductor of a headphone jack and a first input of a voltage comparator, where the SHC produces a second d.c. bias voltage and applies it to a second input of the voltage comparator, and where the third and fourth wires are coupled to tip and ring connections of the headphone jack so that when a headphone plug is inserted into the headphone jack, the difference between the first and second d.c. bias voltages reverses the polarity compared to the difference prior to insertion of the headphone plug to reverse the output state of the voltage comparator; and the microprocessor detecting the reverse in polarity of the output of the voltage comparator reverses the polarity of the d.c. bias voltages and directs the generator to lower the power level to the third and fourth wires which provide audio signal to a headphone, and directs the generator to make the signals on third and fourth wires to be the left and right channel signals.

2. The speaker system according to claim 1, where the predetermined way is data stream substantially similar to the control voltage data from the microprocessor.

3. The speaker system according to claim 1, where the predetermined way is an inverted replica of the control voltage data from the microprocessor.

4. The speaker system according to claim 1, where the predetermined way outputs a delayed replica of the control voltage data from the microprocessor.

5. The speaker system according to claim 1, where the generator powers a memory coupled to the microprocessor.

6. The speaker system according to claim 1, further including:

a switch coupled to the headphone jack and ahead of a speaker driver;

the third wire coupled to an input side of the switch; and the fourth wire coupled to the speaker driver, where the switch is open when the headphone plug is fully inserted into the headphone jack.

7. The speaker system according to claim 1, where the control includes a knob control and a mode button to allow a user to make adjustments to the speaker system.

8. The speaker system according to claim 7, further including a plurality of light emitting diodes (LEDs) coupled to the microprocessor to display the adjustments made by the user.

9. The speaker system according to claim 1, where the generator is housed in a subwoofer.

10. A system for detecting and compensating a voltage in a headphone, comprising:

a headphone jack having a jack tip contact, a jack ring contact, and a jack sleeve contact adapted to receive a headphone plug having a plug tip, a plug ring, and a plug sleeve;

a power amplifier for generating reference audio signals having a predetermined voltage, and the audio signals from the power amplifier outputs first and second signals having opposing voltage polarity;

a speaker-headphone control generating a d.c. offset with a predetermined series resistance applied to the jack tip, jack ring, and jack sleeve contacts of the headphone jack, where the speaker headpbone control provides a voltage comparison between at least one of the contacts of the headphone jack and the predetermined voltage when the headphone plug is inserted into the headphone jack such that a difference in voltage between the at least one of the contacts of the headphone jack and the predetermined voltage provides a reverse output state; and a microprocessor detecting the reverse output state from the speaker headphone control provides a feedback control signal to the power amplifier to adjust the reference audio signal voltages to compensate the audio signal voltages for the headphone;

where the speaker headphone control includes first and second summing and voltage offset networks receiving the first and second signals from the power amplifier, the first and second networks each having a voltage with the predetermined series resistance substantially equal to an average voltage on the first and second signals with the d.c. offset.

11. The system according to claim 10, where the speaker headphone control further includes:

a first filter coupled to the first network to shunt high frequencies to a system ground;

a second filter coupled to the second network to shunt high frequencies to the system ground; and a comparator receiving inputs from the first and second filters for the voltage comparison between the at least one of the contacts of the headphone jack and the predetermined voltage and providing an output state to the microprocessor.

* * * * *